(12) United States Patent
Fath et al.

(10) Patent No.: US 7,179,987 B2
(45) Date of Patent: Feb. 20, 2007

(54) SOLAR CELL AND METHOD FOR MAKING

(75) Inventors: Peter Fath, Constance (DE); Katrin Faika, Constance (DE); Ralph Kühn, München (DE)

(73) Assignee: Universitat Konstanz, Constance (DE)

( * ) Notice: Subject to any disclaimer, the term of this patent is extended or adjusted under 35 U.S.C. 154(b) by 487 days.

(21) Appl. No.: 10/258,895

(22) PCT Filed: Apr. 27, 2001

(86) PCT No.: PCT/DE01/01625

§ 371 (c)(1),
(2), (4) Date: Oct. 30, 2002

(87) PCT Pub. No.: WO01/84639

PCT Pub. Date: Nov. 8, 2001

(65) Prior Publication Data

US 2003/0102022 A1 Jun. 5, 2003

(30) Foreign Application Priority Data

May 3, 2000 (DE) ................ 100 21 440

(51) Int. Cl.
*H01L 31/00* (2006.01)
*H01L 21/00* (2006.01)

(52) U.S. Cl. .............. 136/261; 438/57; 438/98
(58) Field of Classification Search ........ 136/252–259, 136/261; 438/57–98
See application file for complete search history.

(56) References Cited

U.S. PATENT DOCUMENTS

| 4,152,824 A | * | 5/1979 | Gonsiorawski ............. 438/98 |
| 5,082,791 A | | 1/1992 | Micheels et al. |
| 5,461,002 A | | 10/1995 | Safir |

FOREIGN PATENT DOCUMENTS

| EP | 0 776 051 A3 | | 11/1995 |
| JP | 59182577 | | 10/1984 |
| JP | 05-075148 | * | 3/1993 |
| JP | 05075148 | | 3/1993 |

OTHER PUBLICATIONS

Hartiti et al. "Low Temperature Formation. . . " pp. 1519-1522.
Gee et al. "Emitter Wrap-Through Solar Cell" pp. 265-270.
Krygowski et al. "A simultaneously diffused, textured, in situ oxide AR-Coated. . . " pp. 194-199.
Faika et al. "Novel techniquest to prevent edge isolation. . . " pp. 1173-1176.

* cited by examiner

*Primary Examiner*—Nam Nguyen
*Assistant Examiner*—Jeffrey Barton
(74) *Attorney, Agent, or Firm*—Baker & Daniels LLP

(57) ABSTRACT

A method for making a solar cell from crystalline silicon, and a solar cell made from crystalline silicon produced according to the method. Neighboring $p^x n^x$ junctions are electrically insulated by simultaneously introducing a p- and an n-conductive dopant layer. The interleaved contact fingers of the solar cell are electrically insulated with respect to one another by providing contiguous regions with different dopings.

11 Claims, 7 Drawing Sheets

SOLAR CELL AND METHOD FOR MAKING

BACKGROUND OF THE INVENTION

This invention relates to a method for producing a solar cell from crystalline silicon and a solar cell made of crystalline silicon produced by this method.

Short circuits occur in contacting the base of crystalline silicon solar cells by overcompensation of the n-type electrically active emitter (see FIG. 1). These short circuits are caused by the direct connection of the metallic back contact, which contacts the p-type base through the $p^+$-layer, to the emitter region, which is electrically connected to the surrounding $n^+$-layer.

To eliminate these short circuits in the industrial production of conventional solar cells, the $p^+n^+$ junction is insulated by plasma-assisted etching, by mechanical grinding of edges, by applying an insulating layer before the P-diffusion, and by the use of lasers.

In case of more complex cell geometries with interlaced p- and n-type regions (for example like EWT solar cells (J. M. Gee, W. K. Schubert, P. A. Basore; "Emitter Wrap-Through Solar Cell"; $23^{rd}$ IEEE Photo. Spec. Conf., 1993, pp. 265–270), POWER solar cells (G. Willeke, P. Fath; "The POWER silicon solar cell concept"; $12^{th}$ EC PVSEC, Amsterdam, 1994, Vol. 1, pp. 766–68), . . . ), the $p^+n^+$ junction is insulated on a laboratory scale by:

plasma-assisted etching,
local removal of the backside emitter (e.g. by wafer-sawing or by means of a laser),
using dielectric layers as diffusion barriers combined with photolithographic methods and printing techniques as well as wet-chemical process steps.

In past years it has been attempted, fruitlessly, both by companies (S. Robert, K. C. Hessman, T. M. Bruton, R. W. Russel, D. W. Cunningham, "Interdigitated-contact Silicon Solar Cells Made without Photolithography", $2^{nd}$ World Conference and Exhibition on PVSEC, Vienna 1998, pp. 1449–51) and by leading PV research organizations to produce insulation of p- and n-type layers by discovering analogous methods, for example such as subsequent alloying of Al after P-diffusion.

The drawbacks of the known methods can be summarized as follows:

Time- and cost-intensive additional process steps for separating the p- and n-type regions, especially in case of more complex geometries, are a great drawback in production on an industrial scale. The resultant costs, for example, have so far been one reason why back-contact solar cells have not become accepted in industrial production in spite of their numerous advantages in wiring modules.

Physical Drawbacks

1. Production of open, i.e. unpassivated p-n junctions during mechanical border separation.
2. Surface damage caused by plasma-assisted etching, which has harmful effects on cell quality because of the increased recombination associated with it.
3. The space charge zone is located directly on the cell surface from local mechanical milling off of the back face of the silicon wafer. The interference levels introduced by the surface are responsible for increased recombination ("Junction Edge Effects")-> negative effects, especially on $V_{OC}$ and FF.

The problem underlying this invention consists of the fact that the difficulty of insulating p- and n-type doped layers arises with both conventional and novel crystalline silicon solar cells. This problem is solved by the present invention in a simple and elegant manner.

SUMMARY OF THE INVENTION

The task underlying this invention, namely avoiding the formation of short circuits between adjoining p- and n-type regions without any additional process steps for their insulation, is achieved as described below:

The problem can be avoided with the use of a codiffusion process. This means the simultaneous formation of emitter and back surface field (BSF) in a high-temperature step. In this process sequence, immediately after initial cleaning steps, an aluminum layer (alternative dopants such as gallium, boron, etc., that lead to p-conduction, are also conceivable) is applied to the back face of the wafer. This can be done on an industrial scale by PVD (physical vapor deposition) methods such as thermal or electron beam-assisted vapor deposition as well as sputtering, or by screen printing. If interlaced p- and n-type doped regions are to be defined, as is necessary with back-contact, high-voltage, or floating junction solar cells, this can be done by using shadowing masks provided with a p-type grid. The aluminum layer is then alloyed in during the emitter diffusion. The P-diffusion is preferably carried out from the gas phase using dopants containing phosphorus, such as $POCl_3$, $PH_3$, $PBr_3$, etc. Alternative methods are also conceivable, such as imprinting, spraying, or spin-coating of dopant media (pastes and liquids containing P), as well as by the deposition of dielectric layers containing P by methods such as LPCVD (low pressure chemical vapor deposition) or APCVD (atmospheric pressure chemical vapor deposition)—$P:SiO_2$.

In summary it can be stated that the method pursuant to the invention represents a substantial improvement in the simple production of novel solar cells such as back-contact and high-voltage solar cells and solar cells sensitive to light on both sides. Furthermore, it will provide important momentum in the future production of more economical industrial solar cells using thin silicon wafers and the local back-contacting necessary for them. It may also lead to simplification of the present manufacturing method for conventional industrial solar cells.

The advantages of the invention are as follows:
Simplified processing-> cost savings:
Using the codiffusion process, three process steps of standard production
-> emitter formation,
-> BSF formation,
-> process steps for insulating the pn junction are replaced by a single high-temperature step, with the generally customary process steps for insulating the pn junction and which usually comprise several costly individual steps (e.g. whole-surface deposition of silicon nitride (SiN)-> application of etching varnish-> removal of the SiN from the unvarnished areas-> . . . ).
Very high currents because of the electrically active emitter on the back face.
The independence of the shunt values from the length of the alloyed back contact is also an important feature of the codiffused cells, especially with regard to the applicability to more complex cell structures, i.e. the shunt values on a statistical average are a few times 1000 $\Omega cm^2$.
Another advantage of this sequence is the independence of the shunt values from the chosen set of parameters during the codiffusion process (temperatures, duration, $O_2/N_2$ drive-in step, etc.). This opens up the possibility of diffusing both low-ohm emitters for industrial solar cells and high-ohm emitters for high-power solar cells.

Another advantage of the codiffusion process known from the literature is the improved getter action for contaminants, especially with lower-quality mc-Si.

FIG. 1 shows how overcompensation leads to the formation of short circuits:

1. p-type base material 1
2. Emitter formation ($n^+$) by diffusion from the gas phase 4
3. Alloying of a p-type doped layer; the back-face emitter is then overcompensated, and a highly doped $p^+$ BSF region 4 is formed
4. Shunt formation at the $p^+n^+$ junction 8.

The invention was tested as described below:

The codiffusion process was used on 5×5 $cm^2$ standard cells with both flat and grid-type BSF. The shunt values of several thousand $\Omega cm^2$ could be reproduced repeatedly. The efficiency of these codiffused cells with no additional process steps to insulate the p- and n-type regions reached values of up to 13.5%. The process sequence was also used on novel solar cell structures (EWT solar cells). In this case efficiencies of up to 9.55% were reached, and recently even up to 10.1% (without ARC). EWT solar cell production was tested successfully both on Cz-Si and on multicrystalline Si and EFG (Edge-defined Film-fed Growth) Si. The $J_{sc}$ values were 25.4 $mA/cm^2$ for flat Cz-Si EWT cells without ARC; 23.4 $mA/cm^2$ for flat mc-Si EWT cells without ARC. The limiting factors in this process are unoptimized series resistances.

BRIEF DESCRIPTION OF THE DRAWINGS

The invention will be explained below with reference to two examples of the embodiment. The above-mentioned and other features and advantages of this invention, and the manner of attaining them, will become more apparent and the invention itself will be better understood by reference to the following description of embodiments of the invention taken in conjunction with the accompanying drawings, wherein:

FIG. 2b shows the application of a dopant layer to the wafer of FIG. 2a;

Corresponding reference characters indicate corresponding parts throughout the several views. The exemplification set out herein illustrates one preferred embodiment of the invention, in one form, and such exemplification is not to be construed as limiting the scope of the invention in any manner.

DESCRIPTION OF THE PREFERRED EMBODIMENT

Figure 1:
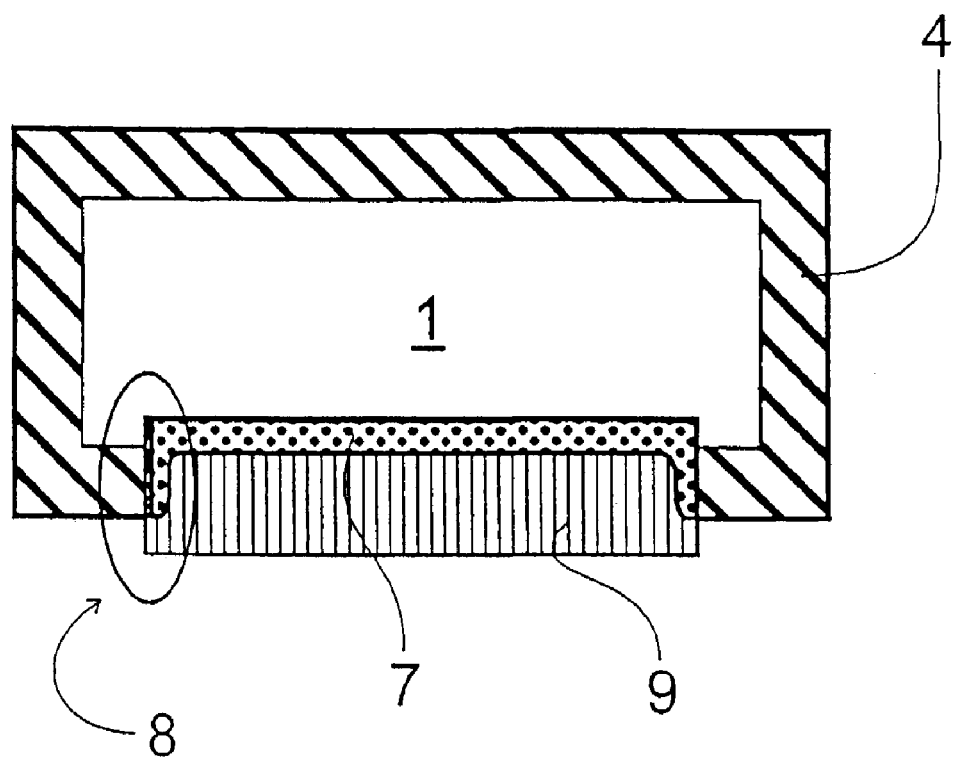
FIG. 1 shows a cross-sectional view of a prior art crystalline silicon solar cell.

In FIGS. 2a to 2d, after etching and cleaning steps, a doping layer of the same type of p-type of dopant layer 2 is applied to a semiconductor wafer, preferably crystalline silicon 1. This layer 2 is then alloyed to form a layer 3 during a high-temperature step with simultaneous formation of an emitter 4 on the areas not covered by layer 2. The emitter is preferably formed by diffusion from the gas phase. The front contact is then applied, and additionally a back contact 5, if needed.

In FIGS. 3a to 3f, after etching and cleaning steps, an emitter layer 4 is diffused over the entire surface of a semiconductor wafer, which is preferably made of crystalline silicon 1. A doping layer 2 of the same type of doping as the initial wafer is then applied locally and is alloyed in at high temperature to form layer 3. A highly doped $p^+$ BSF region 7 and a metallic back contact with eutectic composition 9 are formed. This is removed in order to produce electrical insulation between the $p^+$ and $n^+$ regions. During the alloying, the emitter 4 covered by the doping layer 2 is overcompensated. A smaller back contact is then applied 5 to the $p^+$ region.

A description of the individual steps of the invention follows, with reference to the above described embodiments.

FIGS. 2a–2d: Codiffusion process

Figure 2A:
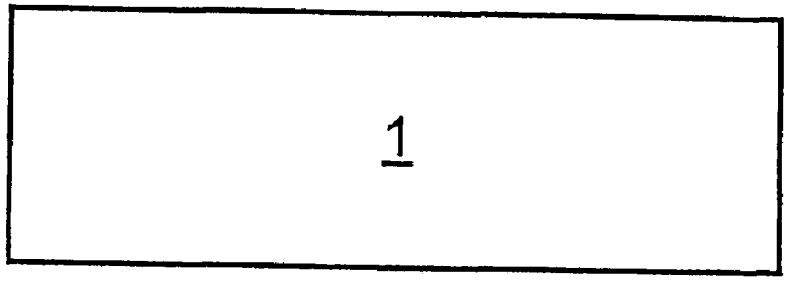
FIG. 2a shows a cross-sectional view of a p-type crystalline silicon wafer.

FIG. 2a: p-type crystalline silicon wafer

Figure 2B:
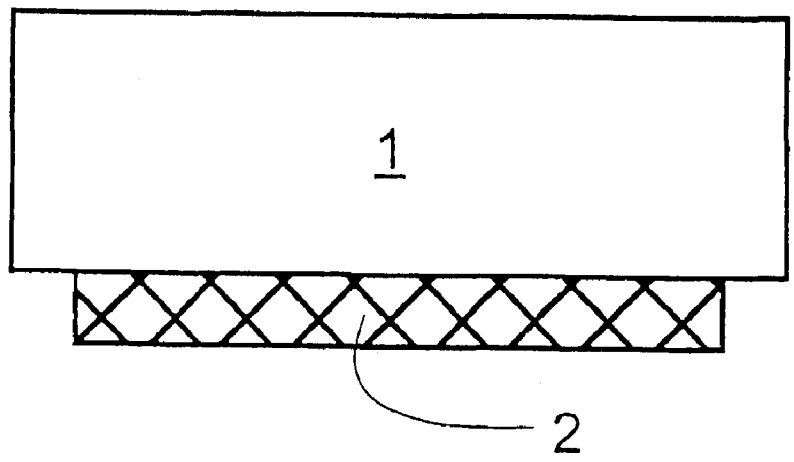

FIG. 2b: Application of a p-type dopant layer 2

Figure 2C:
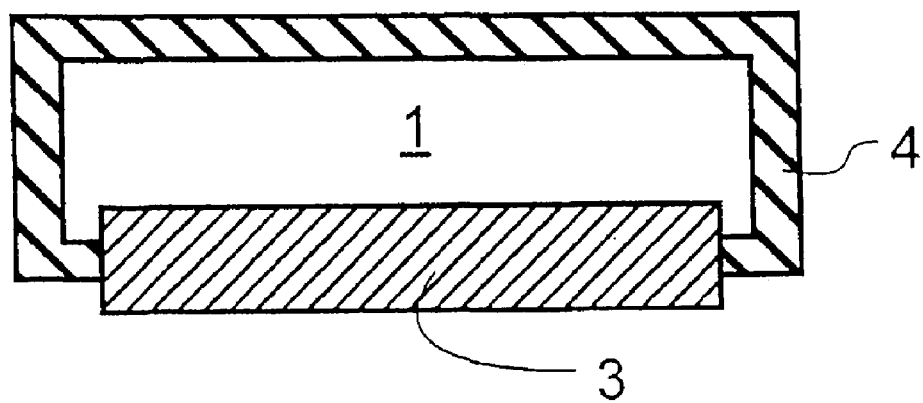
FIG. 2c shows the wafer of FIG. 2b undergoing a codiffusion process.

FIG. 2c: Codiffusion process; i.e. emitter formation (n-type) 4 with simultaneous alloying of the p-type dopant layer 3.

Figure 2D:
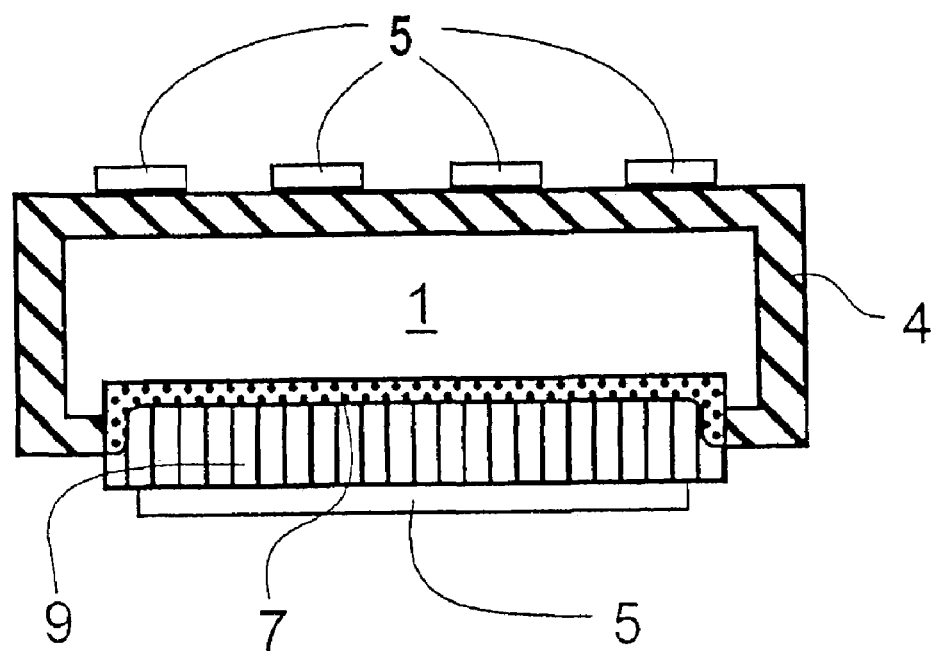
FIG. 2d shows the wafer of FIG. 2c with the application of electrical contacts.

FIG. 2d: Application of the front contact, and if needed also of a back contact with smaller dimensions than the alloyed p-type dopant layer 5.

Figure 3A:
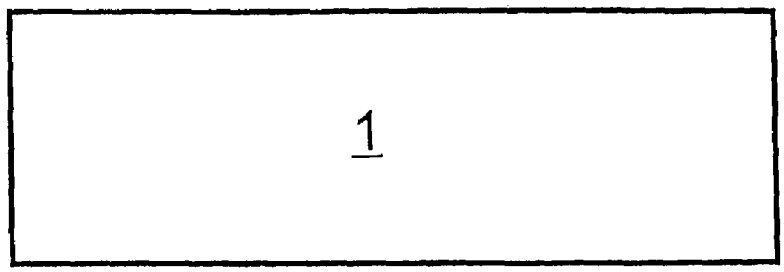
FIG. 3a shows a p-type crystalline silicon wafer, in cross section.

FIGS. 3a–3f: Al-Si etching:

FIG. 3a: p-type crystalline silicon wafer 1

Figure 3B:
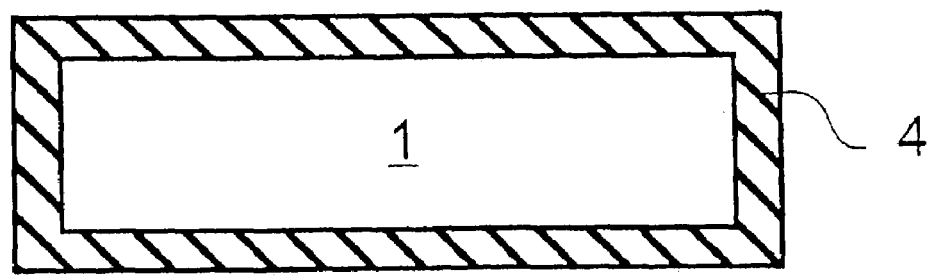
FIG. 3b shows the wafer of FIG. 3a undergoing the production of a emitter.

FIG. 3b: Production of an n-type emitter 4 by diffusion from the gas phase

Figure 3C:
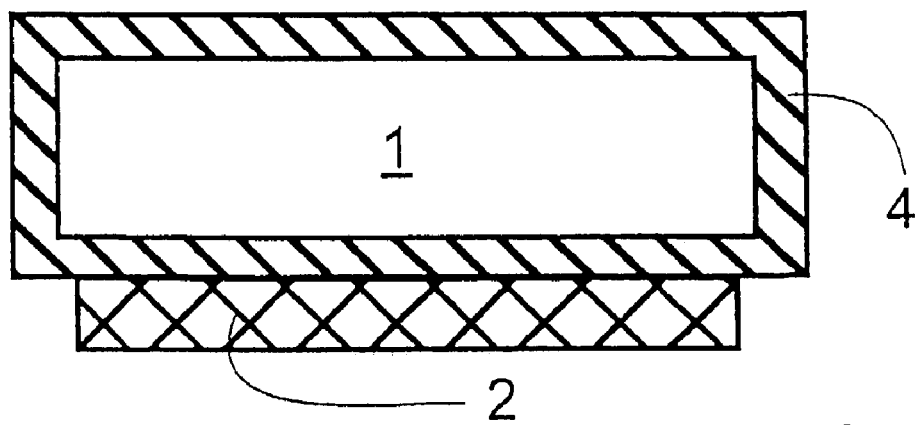
FIG. 3c shows the application of a dopant layer to the wafer of FIG. 3b.

FIG. 3c: Application of a p-type dopant layer 2

Figure 3D:
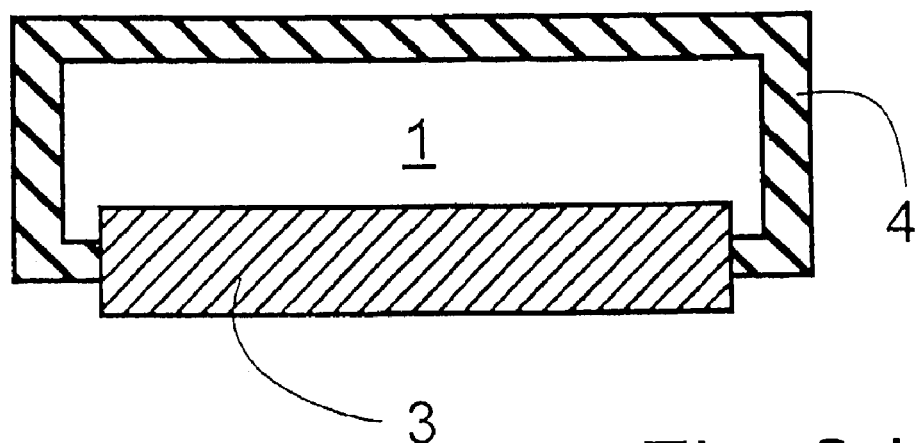
FIG. 3d shows the wafer of FIG. 3c undergoing alloying and a formation of a metallic back contact.

FIG. 3d: Overcompensation of the n-type emitter 4 by alloying in the p-dopant layer with the formation of a highly doped $p^+$ layer 7 and a metallic back contact of eutectic composition 9

Figure 3E:
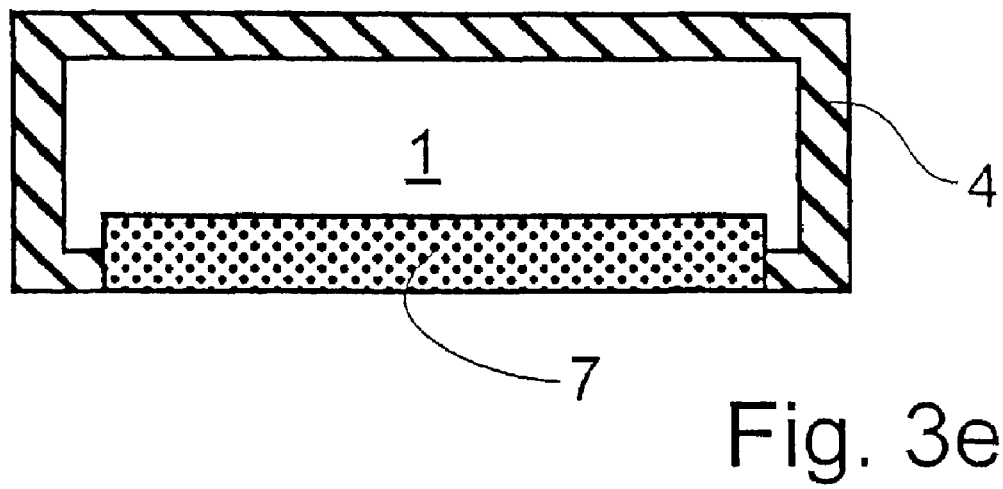
FIG. 3e shows the wafer of FIG. 3d wherein the metallic back contact is removed.
Figure 3F:
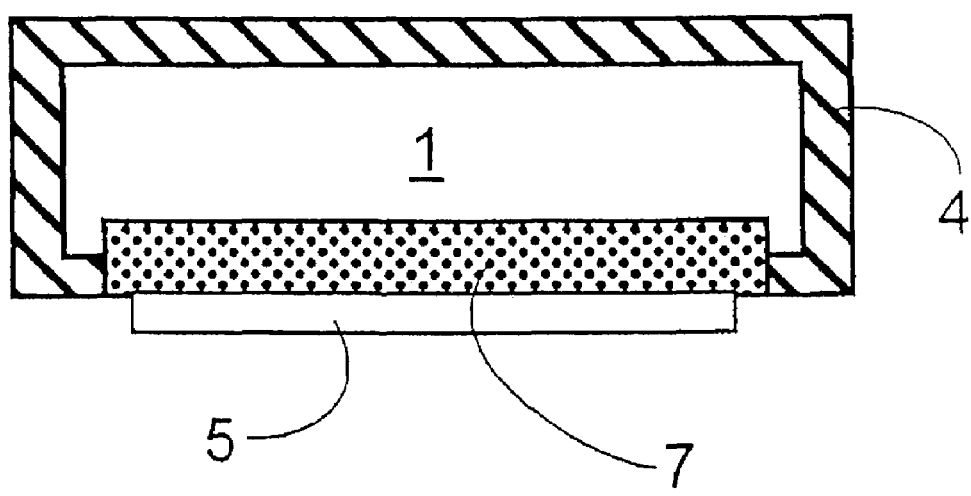
FIG. 3f shows the wafer of FIG. 3e with the application of a front contact.

FIG. 3e: Removal of the metallic back contact 9, so that only the highly doped $p^+$ region 7 remains FIG. 3f: Application of a front contact and of a smaller base contact 5 so that the $p^+n^+$ junction remains unmetallized.

Figure 4:
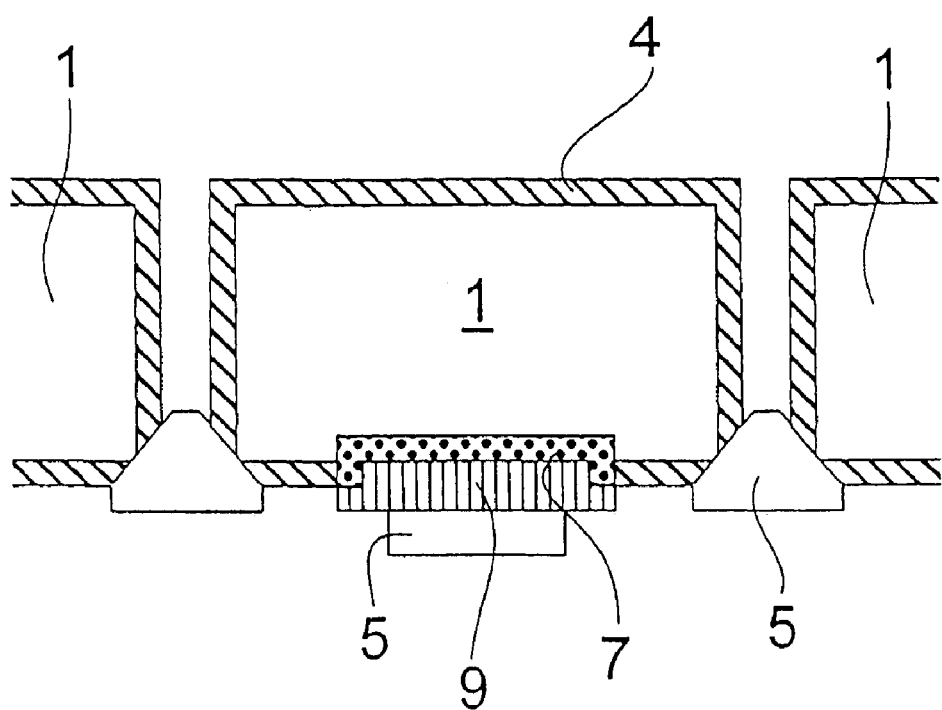
FIG. 4 shows a back contact solar cell.

FIG. 4: Back contact solar cell:

p-type base material 1

Application of a likewise p-type dopant layer; after the codiffusion process, this forms a highly doped $p^+$ BSF region 7 and a metallic back contact of eutectic composition 9. Under some circumstances this can serve as the base contact. Alternatively, in order to produce good conductivity, a new base contact with smaller dimensions 5 can also be applied.

During the codiffusion process, the n-type emitter 4 is simultaneously formed, as well as a melt of p-type starting material 1 and of the p-type dopant layer 2 applied to it.

The front contact 5 is then applied.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

The invention claimed is:

1. A method for producing solar cells from a crystalline silicon semiconductor wafer (1), said method comprising:
    diffusing an emitter layer (4) of a different dopant type than the wafer on the entire surface of a semiconductor wafer (1);
    locally applying a doping layer (2) of the same type of doping as the semiconductor wafer (1);
    alloying in the doping layer (2) to form a doped layer (3) such that a highly doped back surface field region (7) and a metallic back contact with eutectic composition (9) are formed;
    removing the eutectic composition (9) to produce electric insulation between $p^+$ and $n^+$ regions; and
    applying a back base contact (5) of smaller dimensions than said back surface field region (7).

2. The method according to claim 1, wherein the crystalline silicon (1) is p-type silicon.

3. The method according to claim 1, wherein the different dopant type emitter layer (4) comprises phosphorus-doped silicon.

4. The method according to claim 3, wherein the emitter layer (4) is produced from the gas phase.

5. The method according to claim 1, wherein the doped layer (3) comprises p-type aluminum-doped silicon.

6. The method according to claim 1, wherein the aluminum-doped silicon is produced by applying one of a layer of aluminum and a layer of a substance containing aluminum.

7. The method according to claim 6, wherein a phosphorous containing layer is first applied, and thereafter the layer containing aluminum.

8. The method according to claim 7, wherein the layer containing aluminum overcompensates the phosphorous containing layer.

9. The method according to claim 7, including the step of forming a highly doped $p^+$ region with an alloying process.

10. The method according to claim 9, including the step of removing excess aluminum silicon mixture after the alloying step.

11. The method according to claim 9, including the step of applying a new narrower contact to the highly doped $p^+$ region.

* * * * *